(12) United States Patent
Rossi et al.

(10) Patent No.: US 8,865,999 B2
(45) Date of Patent: Oct. 21, 2014

(54) THERMOELECTRIC CONVERTER WITH PROJECTING CELL STACK

(71) Applicant: NanoConversion Technologies, Inc., San Jose, CA (US)

(72) Inventors: David M. Rossi, San Francisco, CA (US); Michael P. Staskus, San Jose, CA (US); Derek W. Nam, Los Altos Hills, CA (US)

(73) Assignee: NanoConversion Technologies, Inc., San Jose, CA (US)

( * ) Notice: Subject to any disclaimer, the term of this patent is extended or adjusted under 35 U.S.C. 154(b) by 78 days.

(21) Appl. No.: 13/651,049

(22) Filed: Oct. 12, 2012

(65) Prior Publication Data

US 2013/0098419 A1 Apr. 25, 2013

Related U.S. Application Data

(60) Provisional application No. 61/627,949, filed on Oct. 21, 2011.

(51) Int. Cl.
*H01L 35/02* (2006.01)
*H01L 35/32* (2006.01)
*H01G 9/21* (2006.01)

(52) U.S. Cl.
CPC .................................... *H01G 9/21* (2013.01)
USPC ............ 136/244; 136/205; 136/230; 136/234

(58) Field of Classification Search
CPC .......... H01L 35/02; H01L 35/30; H01G 9/21; H01M 10/3918; H01M 10/399; H01M 10/39
USPC ........................................................ 136/230
See application file for complete search history.

(56) References Cited

U.S. PATENT DOCUMENTS

| | | | | |
|---|---|---|---|---|
| 4,808,240 A * | 2/1989 | Sievers | | 136/202 |
| 4,868,072 A | 9/1989 | Abbin et al. | | |
| 5,228,922 A | 7/1993 | Sievers | | |
| 5,441,575 A * | 8/1995 | Underwood et al. | | 136/202 |
| 5,928,436 A | 7/1999 | Borkowski et al. | | |
| 6,433,268 B1 | 8/2002 | Hausgen | | |
| 8,344,237 B1 * | 1/2013 | Bennett | | 136/205 |
| 8,378,208 B1 * | 2/2013 | Bennett | | 136/236.1 |
| 8,575,468 B2 * | 11/2013 | Bennett | | 136/206 |
| 8,648,245 B1 * | 2/2014 | Bennett | | 136/205 |
| 2003/0201006 A1 | 10/2003 | Sievers et al. | | |
| 2009/0108755 A1 * | 4/2009 | Cho et al. | | 313/585 |

FOREIGN PATENT DOCUMENTS

JP     07163167 A     6/1995

OTHER PUBLICATIONS

Cole, Terry, "Thermoelectric Energy Conversion with Solid Electrolytes," Science, vol. 221, No. 4614, Sep. 2, 1983, pp. 915-920.

(Continued)

*Primary Examiner* — Jonathan Johnson
*Assistant Examiner* — Bethany Lambright
(74) *Attorney, Agent, or Firm* — Charles Shemwell

(57) ABSTRACT

A thermoelectric converter is formed by a plenum divided into high and low pressure chambers by a partition and includes a stack of series-coupled alkali-metal thermoelectric cells that projects orthogonally from the partition into one of the chambers.

17 Claims, 8 Drawing Sheets

(56) References Cited

OTHER PUBLICATIONS

El-Genk et al., "Performance Comparison of Potassium and Sodium Vapor Anode, Multi-Tube AMTEC Converters," Elsevier Science Ltd., Energy Conversion and Management 43, 2002, pp. 1931-1951.

PCT International Search Report in International Application No. PCT/US2012/060081, Mar. 29, 2013, 10 pages.

Schock et al., "Parametric Analyses of AMTEC Multitube Cells and Recommendation for Revised Cell Design," Proceedings of the 14th Symposium on Space Nuclear Power and Propulsion, p. 1395, (1997).

Sievers et al., Remote Condensing for High Efficiency AMTEC Cells', Proceedings of the 28th Intersociety Energy Conversion Engineering Conference, pp. 1.843, (1993).

Underwood et al., "An AMTEC Vapor-Vapor, Series Connected Cell," Proceedings of the 9th Symposium on Space Nuclear Power Systems, p. 1331, (1992).

* cited by examiner

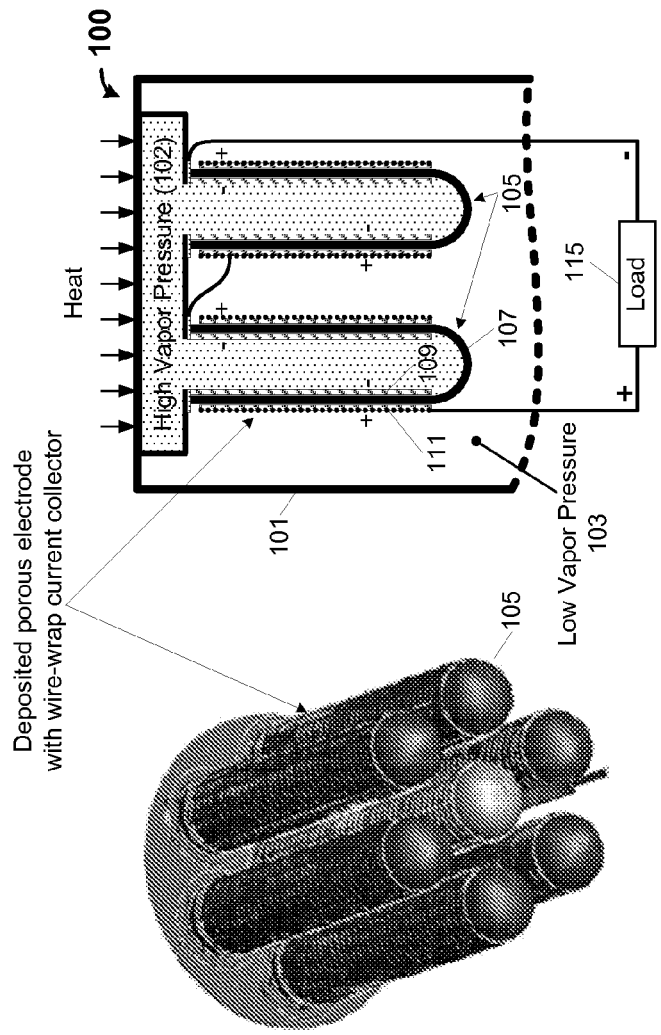
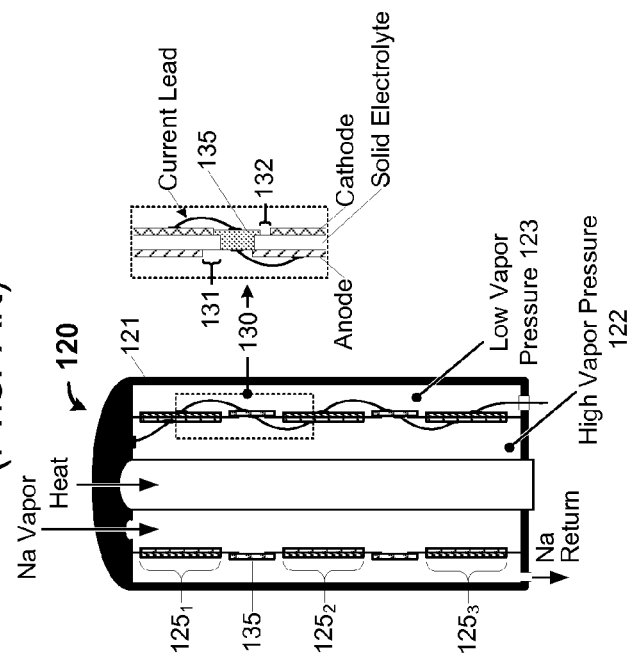
FIG. 1A (Prior Art)
FIG. 1B (Prior Art)

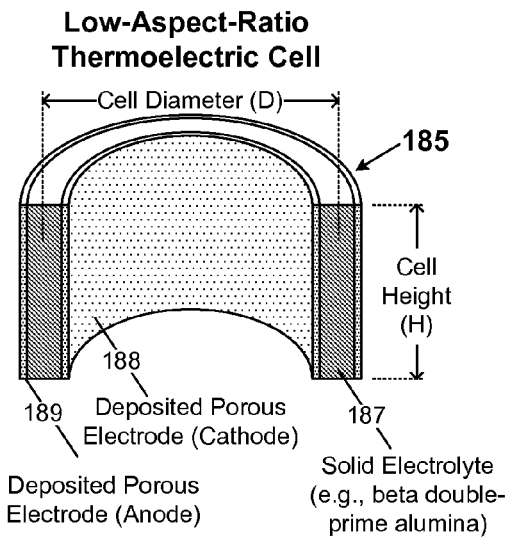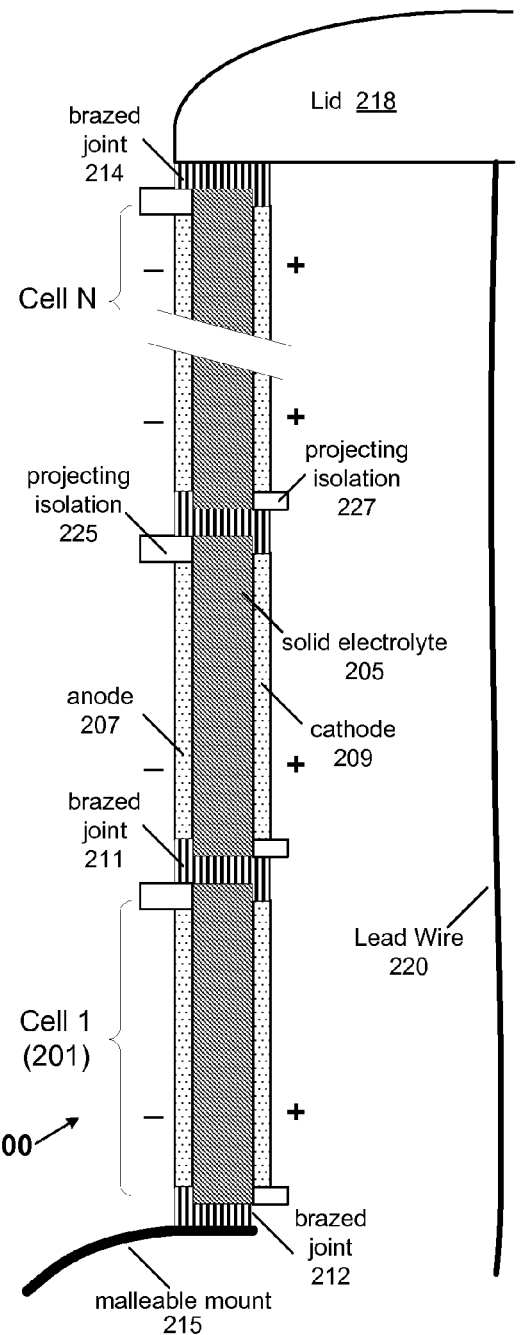

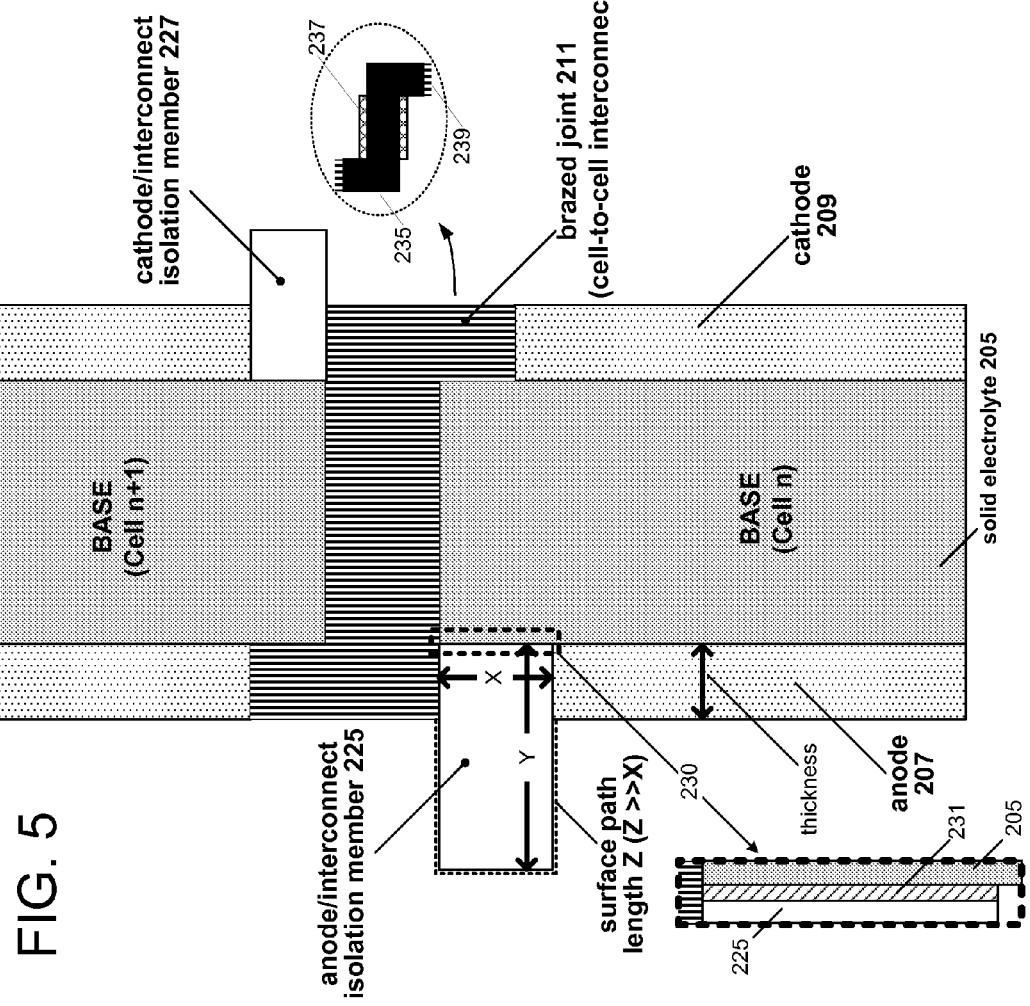

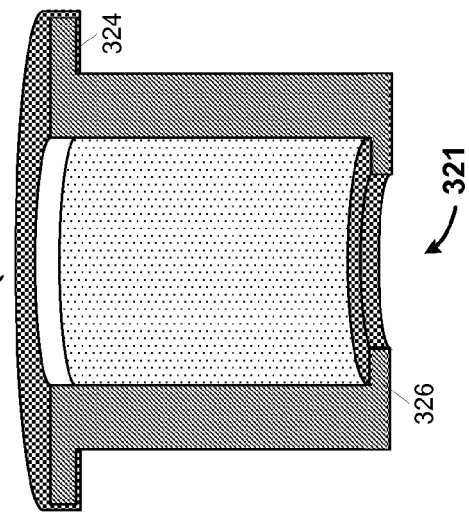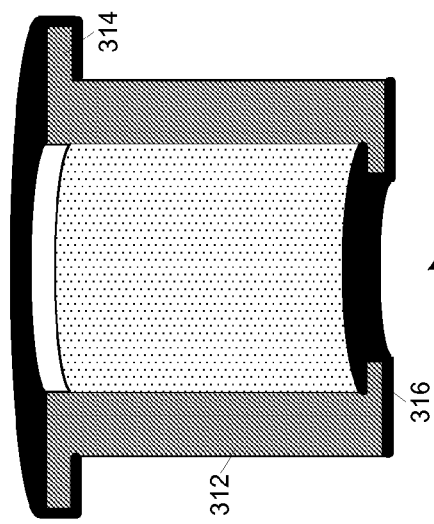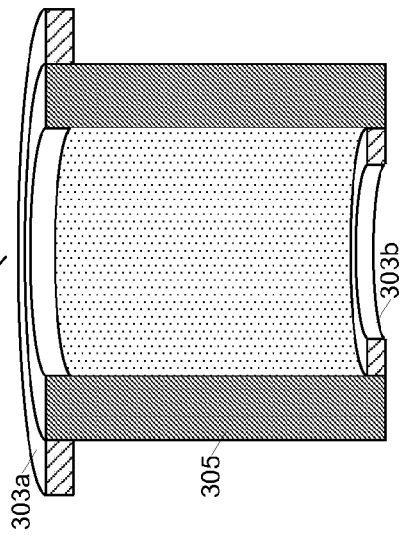

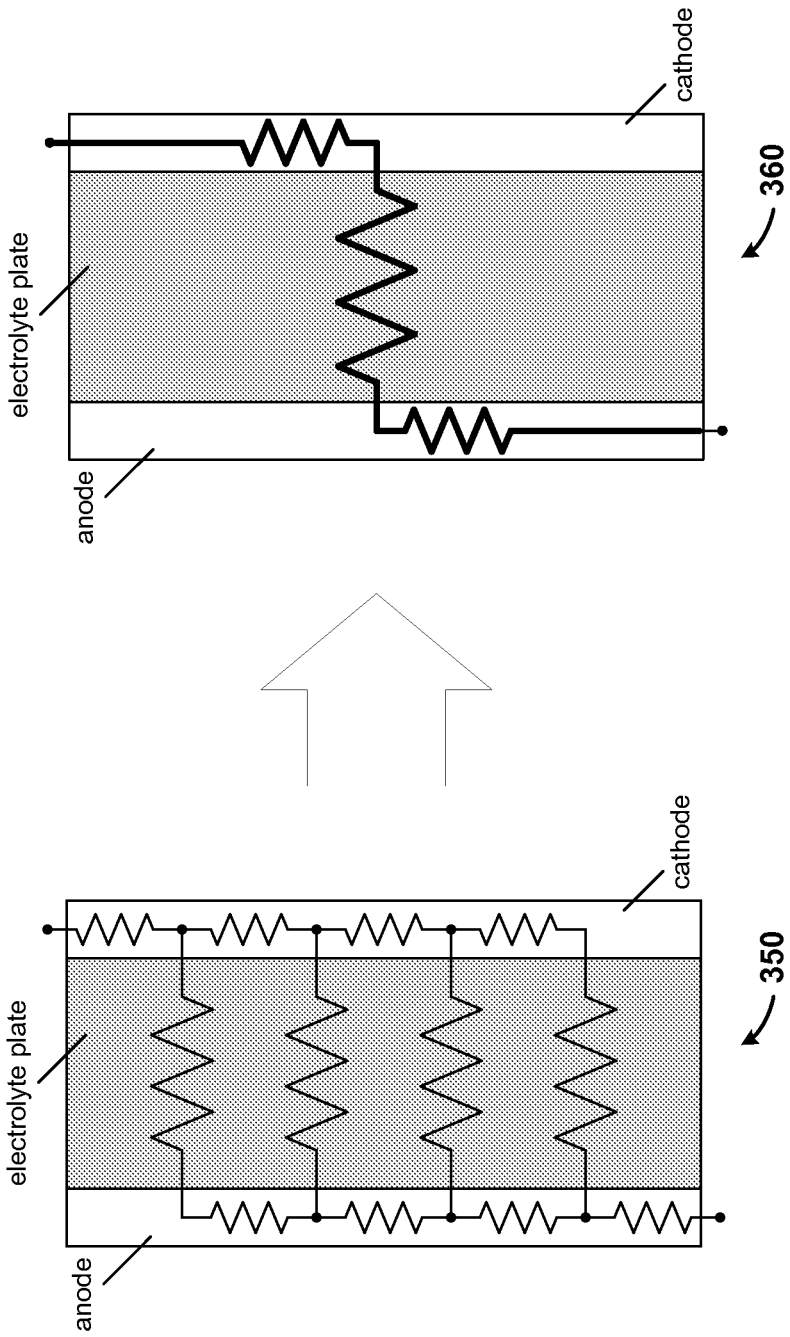

THERMOELECTRIC CONVERTER WITH PROJECTING CELL STACK

CROSS REFERENCE TO RELATED APPLICATIONS

This application hereby claims priority to and incorporates by reference U.S. Provisional Application No. 61/627,949, filed Oct. 21, 2011 and entitled "Concentration-mode Thermoelectric Converter (C-TEC)."

TECHNICAL FIELD

The disclosure herein relates to thermal-to-electric power generation.

BACKGROUND

FIGS. 1A and 1B illustrate prior-art implementations of alkali-metal thermal-to-electric converters (AMTECs), 100 and 120. In the implementation of FIG. 1A, a plenum 101 is divided into high and low sodium vapor pressure chambers 102, 103 with test-tube-shaped thermal-to-electric cells 105 projecting from the high pressure chamber into the low pressure chamber. Each of the cells is formed by a solid electrolyte projection 107 sandwiched between porous interior and exterior electrodes—the anode 109 and cathode 111, respectively. The solid electrolyte serves as both an ionic conductor and an electronic barrier, conducting heat-activated sodium ions between the two chambers (i.e., across the pressure gradient) while the corresponding free electrons are collected at the anode. The resulting electric potential across the solid electrolyte yields electronic current from the anode through an external load 115 (delivering power) and back to the cathode where the electrons recombine with the electrolyte-crossing sodium ions in a reduction (or neutralization) to sodium vapor. An electromagnetic pump (not shown) is provided to return pooled liquid metal sodium from the low pressure chamber to the high pressure chamber.

To limit power-draining ohmic losses, wire-wrapping or other auxiliary current collection structures typically overlay the relatively low-conductance porous electrodes. Unfortunately, such structures tend to degrade prematurely in the thermally challenging environment of the converter. For example, wrapped wires tend to lose physical and electrical contact over time (e.g., due to non-uniform thermal expansion/contraction of the wires and structures they encircle), increasing $I^2R$ loss and thus degrading the power density of the converter.

In thermal-to-electric converter 120, shown in cross-section in FIG. 1B, a stack of series-coupled, ring-shaped AMTEC cells $125_1$-$125_3$ extends between the upper and lower walls of a cylindrical plenum 122, thus forming concentric annular chambers 122, 123 (i.e., high and low vapor pressure chambers) separated by the solid electrolyte cell walls. In theory, this arrangement mitigates the $I^2R$ losses that plague the tubular cell design by raising the output voltage (i.e., the sum of the voltages of individual cells by virtue of their series interconnection) and correspondingly lowering the output current of the overall converter. In practice, however, this coaxial chamber arrangement suffers from a number of drawbacks. First, care must be taken to avoid shorting the anodes or cathodes of adjacent cells (i.e., electrodes at different potentials) through the cell-to-cell interconnect structure, a complication addressed by leaving gap 131 (shown in detail view 130) between the anode of each lower potential cell and the interconnect to the higher potential cell below (a similar gap 132 is provided between the cathode of each cell and the interconnect to the lower potential cell above). Unfortunately, unless these electrode gaps, which constitute dead zones from a power generation standpoint, are made impractically large, significant leakage current flows across the voltage gradient, degrading device power density. Also, the junction of the exposed solid electrolyte and conductive interconnect in the presence of hot sodium vapor constitutes a triple point at which electrons released by sodium ionizations are shunted through the cell-to-cell interconnect to the cell cathode, further depleting the voltage differential across the solid electrolyte and thus further degrading the power density of the converter. While sputtered non-porous insulators have been proposed to cover the gap (and thus the triple point), the viability of such coverings are doubted, particularly in the high-pressure chamber. Further, investigations show that sputtered coatings do little to reduce leakage current flowing across the voltage gradient between anode and interconnect.

The annular design of converter 120 brings additional complications. For one, the cell stack and its interconnection to opposite ends of the plenum housing are subjected to significant stress/strain during thermal expansion/contraction (i.e., as the plenum housing and cell stack components tend to exhibit expand/contract non-uniformly), mechanical wear forces that tend to degrade device power density and lead to premature failure, particularly in applications that involve frequent temperature cycling. The coaxial heating arrangement also adds complexity (requiring heat to be injected into a blind hole) and tends to be thermally inefficient as heat radiates directly from the interior heat source toward the cold containment wall of the plenum. Perhaps more significantly, the large temperature gradient between the heat source and plenum wall (and relatively short distance between the cell stack and cold plenum wall) and makes it difficult to prevent sodium condensation on the cell stack surface, a highly problematic phenomenon as the electrically conductive sodium condensate can short the different-potential cells to one another, severely disrupting operation of the converter.

Yet other issues plague the implementation of FIG. 1B. For example, the high voltage across the gap between the final cell in the stack and its interconnection to the housing (i.e., in view of the physical cell stack connection at both ends of the housing) presents a source of leakage current that becomes increasingly troublesome as the cell count, and thus the voltage across the last gap, grows, discouraging more than a relatively small number of cells in the complete stack (e.g., three cells). Similarly the metal plates 135 used to interconnect adjacent cells not only increase component count, but also constitute dead zones that consume an increasing proportion of the cell stack surface area as cell count grows, again discouraging more than a small number of stacked cells. Also, in the implementations of both FIGS. 1A and 1B, the sensitive device cathode is exposed by line-of-sight contact to the chamber walls of the low-pressure vapor chamber, leading to life-shortening electrode contamination from materials in the housing, such as Chromium or Manganese escaping from stainless steel.

BRIEF DESCRIPTION OF THE DRAWINGS

The disclosure herein is illustrated by way of example, and not by way of limitation, in the figures of the accompanying drawings and in which like reference numerals refer to similar elements and in which:

FIGS. 1A and 1B illustrate prior-art alkali-metal thermal-to-electric converters;

FIG. 3 illustrates a cross-section of an exemplary low-aspect-ratio thermoelectric cell that may be used to implement individual cells within the projecting cell stacks of FIG. 2;

FIG. 4 illustrates a partial cross-section of a projecting cell stack according to one embodiment;

FIG. 5 illustrates an expanded view of the cell-to-cell interconnect and projecting isolators of FIG. 4, emphasizing the extended surface path length between anode and cell interconnect;

FIG. 6 illustrates an alternative interconnection of thermoelectric cells in a projecting cell stack;

FIGS. 9A-9C illustrate alternative implementations of discrete and plate-integrated isolators that may be used to implement the projecting isolators (or insulators) described in reference to FIGS. 4-8; and FIG. 10 illustrates a lumped-element model of the resistance of the electrodes (electron conductors) and electrolyte of a thermoelectric cell within a projecting cell stack.

DETAILED DESCRIPTION

A thermal-to-electric converter having a plenum divided into high and low pressure chambers by a partition and a stack of alkali-metal thermal-to-electric cells that projects orthogonally from the partition into one of the chambers is disclosed herein in various embodiments. In one embodiment, the partition is formed by a substantially planar member extending between side walls of the plenum to divide the plenum into high vapor pressure and low vapor pressure chambers, and having one or more openings covered by respective cell stacks that are capped on their unsecured ends. By securing the cell stack at only one end (i.e., at the partition opening), the cell stack is free to expand and contract without suffering the mechanical stress/strain forces that plague cell stacks secured at both ends. Further, by projecting the cell stack into the high vapor pressure chamber so that heat is directed inwardly from the plenum housing toward the cell stack, a highly efficient thermal arrangement is obtained (i.e., as heat energy radiating through the cell stack remains predominantly in the high vapor pressure chamber instead of flowing, for example, to a cold plenum wall) and maintains the cell stack at a temperature that avoids working fluid condensation. Also, in a number of embodiments, the cells in a given stack are electrically interconnected and sealed to one another by a continuous joint, simplifying construction of the cell stack and limiting inter-cell dead space. In other embodiments, shunt currents are suppressed by an isolation barrier that projects outwardly (and/or inwardly) from the wall of the cell stack to increase the electrical path length between cell electrodes and cell interconnects of different potential. In yet other embodiments, solid electrolyte components of individual cells are physically isolated from cell-to-cell interconnects via extensions of the projecting isolation barriers into the cell wall and/or by one or more ceramic joints to provide triple-point isolation. These and other embodiments and their features and benefits are discussed below.

Figure 2:
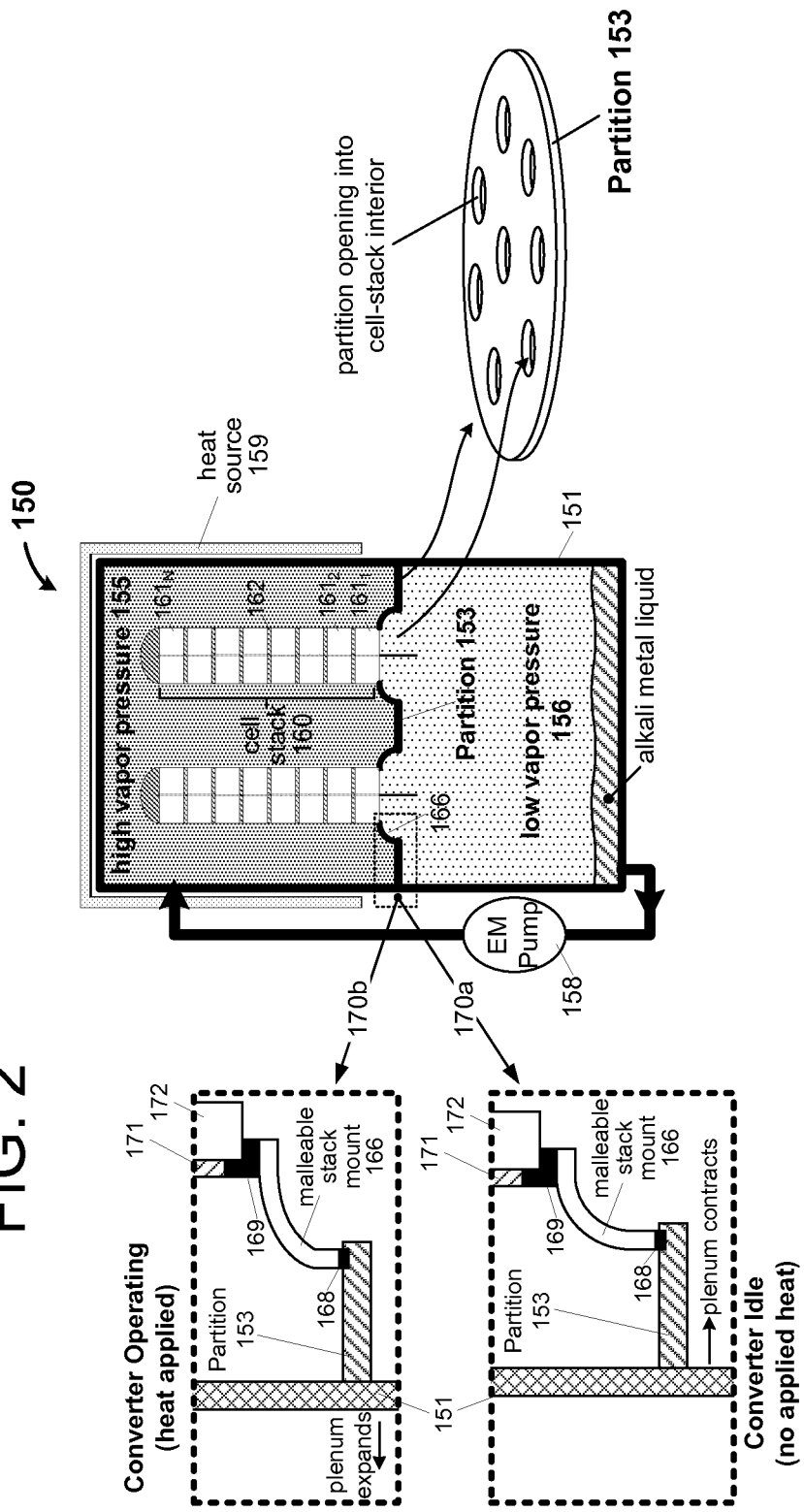
FIG. 2 illustrates an embodiment of a thermal-to-electric converter having multiple stacks of alkali-metal thermal-to-electric conversion cells that project orthogonally from a chamber-defining partition.

FIG. 2 illustrates an embodiment of a thermal-to-electric converter 150 having multiple stacks 160 of alkali-metal thermal-to-electric conversion cells ($161_1$-$161_N$) that project orthogonally from a chamber-defining partition. Converter 150 is also referred to as a "thermoelectric" converter, as the terms thermal-to-electric and thermoelectric are used interchangeably herein to refer to the conversion of heat energy to electricity. In the example presented in FIG. 2, the partition 153 is formed by a substantially planar disk that is secured about the sidewall of a cylindrical plenum 151 (also referred to herein as an enclosure or converter housing), thus dividing plenum 151 into high- and low-vapor-pressure chambers 155 and 156. In the implementation shown, an electromagnetic pump 158 is coupled between the two chambers to pump alkali metal liquid from the low pressure chamber to the high pressure chamber, though a wick (operating through capillary action) or any other practicable mechanism for transporting alkali metal liquid between the chambers may be employed in alternative embodiments.

A heat source 159 applied to the exterior surface of the plenum wall adjacent the high pressure chamber (although heat sources may alternatively or additionally projected into or be embedded within the high pressure chamber, and/or a remote boiler may be used) heats the high pressure alkali metal vapor therein (e.g., sodium vapor, potassium vapor or any other practicable alkali metal vapor) to a temperature that creates a pressure (or concentration) gradient between the two chambers, the driving force for device operation. More specifically, the openings in partition 153 effectively extend the low pressure chamber into the interiors of the cell stacks 160, establishing a pressure or concentration gradient across the solid electrolyte wall of each cell $161_i$ that promotes alkali metal ionization and propels ionized alkali metal ions through the solid electrolyte to the interior surface of each cell. Electrons freed by the ionization reactions are blocked by the solid electrolyte and collected by a porous electrode (i.e., anode) on the exterior cell surface, thus developing an electrical potential between the exterior and interior surfaces of each cell.

Still referring to FIG. 2, a cell-interconnect structure 162 extends between the cathode and anode of neighboring cells (and also seals the gap between adjacent cells to maintain separation between the high and low pressure chambers) to couple the constituent cells of a stack 160 in series. Accordingly, the overall electrical potential of each projecting cell stack 160 is the product of the number of stacked cells (N) and the voltage per cell ($V_{cell}$) and thus N times higher than the voltage of a monolithic projecting cell. Furthering this comparison and assuming a comparable power density and net impedance between the stacked-cell and monolithic-cell projections, the current flow in projecting cell stack 160 will be $1/N^{th}$ of the current flowing in the monolithic implementation which yields dramatically lower (i.e., divided by $N^2$) ohmic losses and thus correspondingly higher thermoelectric conversion efficiency. As discussed below, the higher output voltage/lower output current nature of the stacked cell projection provides tolerance for higher impedance electrodes and thus designs that forego the costly and unreliable auxiliary current collection structures (e.g., wire wrapping) typically required by conventional designs. Accordingly, in a number of embodiments discussed below, anode and cathode electrodes are formed by porous metal depositions alone, improving device reliability and longevity and enabling simple and effective implementation of the more thermally efficient chamber arrangement (i.e., high-pressure chamber on the outside of the projecting cell stacks) shown in FIG. 2.

The solid electrolyte plates that form walls of the cell stacks generally exhibit low thermal expansion rates in comparison with oxidation-resistant materials (e.g., stainless steel) used to form the plenum housing and partition 153. Accordingly, to account for potentially non-uniform thermal expansions of plenum 151, partition 153 and projecting cell stacks 160, a malleable stack-mount member 166 is provided to secure the initial cell ($161_1$) of a given stack to the perimeter of the corresponding partition opening. In one embodiment, shown in detail views 170a and 170b for example, stack-mount 166 is implemented by a Niobium dome (Molybdenum, Tantalum, Titanium, various alloys, etc. may also be used) brazed or otherwise secured and electrically coupled between the perimeter of the partition opening and the underside of the initial cell. This malleable dome-shaped stack-mount 166 may be bonded directly to the low-thermal-expansion-rate solid electrolyte plate 172 without undue stress at joint 169, while the radius of stack-mount 166 will plastically deform to relieve the stress induced at the high-thermal-expansion-rate partition material in joint 168 (which may be formed within a notch, groove, channel or other recess disposed about an opening in partition 153) without transferring this stress to solid electrolyte plate 172. Accordingly, through this arrangement, joints 168 and 169 and malleable stack-mount 166 secure initial cell $161_1$ to partition 153 (sealing the partition opening and thus maintaining separation between the high and low pressure chambers) and electrically couple the partition to an anode electrode 171 of the initial cell. Comparing the two detail views 170a and 170b, which show the converter in idle (unheated) and operating (heated) states, malleable stack-mount member 166 plastically deforms about the dome radius (i.e., exhibiting a progressively larger interior radius at the stack-mount/partition joint 168 and thus flattening the dome) as the partition becomes hot (enlarging the partition opening as the partition and plenum wall expand), and contracts as the partition cools, thus protecting the joint 169 and the solid electrolyte plate of the base cell in the projecting cell stack from stress induced in the malleable stack-mount 166 over the temperature range seen by the projecting cell-stacks 160 and partition member 153.

As discussed above, the single-sided mounting of the projecting cell stacks arrangement of FIG. 2 provides freedom for the cell stacks to expand and contract axially (i.e., in a direction perpendicular to the plenum partition) without suffering the mechanical compression and tension that afflicts the two-side-connected cell-stack of FIG. 1B. Additionally, establishing the high pressure chamber on the outside of the cell stacks (i.e., the inside-out chamber configuration) ensures that high pressure alkali metal vapor forces all the cell-interconnect joints together in compression, avoiding the catastrophic joint failure that could result from severe tensile pressure in the opposite configuration or in the double-side-connected annular chamber arrangement of FIG. 1B (which is subject to bowing of the cell wall and thus substantial tensile forces on the cell-interconnect). Also, the sensitive cathode is inside the electrolyte cell and thus protected by low line-of sight exposure to contaminant sources (e.g., stainless steel plenum wall) and pumping action from the flow of sodium vapor out of the electrolyte assembly through the partition opening into the broader expanse of the low pressure chamber. The inside-out chamber configuration also enables a thermally efficient heating configuration as noted above, avoiding the large thermal losses (and need for expensive heat shield arrangements) of the internally heated cells shown in FIGS. 1A and 1B.

With regard to the particular embodiment shown in FIG. 2, specific numbers of partition openings, cell stacks, cells per stack, converter orientation and so forth are depicted for purposes of explanation only—any and all such parameters may be changed in alternative embodiments. Also, while cylindrically-shaped cell-stacks disposed about circular partition openings (or orifices) in a disk-shaped partition (and corresponding cylindrically shaped plenum) are shown in FIG. 2 and carried forth in examples below, cell-stacks and corresponding partition openings and/or partition and plenum outlines may have other shapes (e.g., triangular, quadrilateral or otherwise polygonal) in alternative embodiments, according to the form-factor beneficial in a given application or manufacturing process. Further, while a malleable stack-mount member 166 is provided to reduce stresses caused by differing thermal expansions of the projecting cell stacks and materials used to form the plenum housing and partition (i.e., 151 and 153, respectively), in alternative embodiments the plenum housing and/or partition may be formed from materials (e.g., alumina) that exhibit lower thermal expansion coefficients similar to materials within the projecting cell stacks, enabling malleable stack-mount member 166 to be omitted in some designs.

FIG. 3 illustrates a cross-section of an exemplary low-aspect-ratio thermoelectric cell 185 that may be used to implement individual cells within the projecting cell stacks of FIG. 2. As shown, the cell is formed by a cylindrically-shaped solid electrolyte plate 187 (e.g., sodium beta or beta" alumina solid electrolyte or potassium beta or beta" alumina solid electrolyte in the case of sodium or potassium working fluids, respectively, or mixtures of beta and beta" phases plus stabilizers, etc. all of which are referred to inclusively herein as "BASE") having porous electrodes deposited on its interior and exterior surfaces to form a cathode 188 and anode 189, respectively. Despite the relatively low conductance of the porous electrodes, studies reveal that, by limiting the cell height in a relatively low aspect ratio cell (i.e. low height-to-diameter ratio or low height-to-perimeter ratio) and providing structures to restrict undesired shunt currents, the low electrode conductance may be tolerated in view of the reduction in current achieved in the stacked structure, thus avoiding the need for wire wrapping or other costly and unreliable auxiliary current collection. More specifically, there tends to be a design optimization where the height of the cell is sufficiently tall to avoid undue proliferation of cell-to-cell interconnects (dead space from a power generation standpoint), but not so tall as to raise electrode impedance to a level require auxiliary current collection. In some embodiments, for example cell heights under 3.0 centimeters, or even under 1.0 centimeters (e.g., 8 millimeters (8 mm)), may fall within this optimization range. The cell height criteria may be used to determine the cell count within a given converter design, for example, by dividing the chamber height (less an idle-temperature tolerance between the top of the stack and plenum wall) by the target cell height. As an example, in a converter having a 10 centimeter chamber height (after accounting for maximum height of the malleable stack mount) with a 4 mm tolerance, twelve 8 mm cells may be stacked between the partition and plenum. Different optimum cell heights may apply in embodiments using different types of porous electrodes, different chemistries (e.g., potassium vapor as the working fluid), cell diameters and so forth. Also, for conical or cylindrically shaped cells, at least, the design optimization may be expressed in terms of the cell aspect ratio (i.e., ratio of axial length to diameter), with aspect ratios of 0.1 to 1 and preferably but not necessarily below 0.5.

FIG. 4 illustrates a partial cross-section of a projecting cell stack 200 according to one embodiment. As in embodiments discussed above, each of the N cells 201 includes a solid electrolyte plate 205 (e.g., beta double-prime alumina solid electrolyte (BASE)) sandwiched between porous anode and cathode electrodes, 207 and 209, respectively. A brazed joint 211 extending continuously from the cathode of each lower potential cell to the anode of the higher potential neighbor (i.e., cathode of cell 'i' to anode of cell 'i+1', where 'i' is the cell index) serves the dual function of coupling the cells in series (thus establishing a progressively incremented potential, $i*V_{Cell}$, at the cathode of each cell) and also sealing the gap between the cells. In contrast to the metal plates welded between neighboring cells in the prior-art cell stack of FIG. 1B, the single-joint interconnect reduces component count (simplifying and economizing device production) and yields a substantially smaller dead zone between cells, thus enabling the cell count to be extended (e.g., beyond the three cells shown in FIG. 1B) without unduly compromising the power density of the converter.

Brazed joints 212 and 214 are also provided at the mounting and free ends of the stack (i.e., at the initial and final cells in the stack), respectively, with joint 212 securing and electrically coupling the initial (or base) cell in the stack to an electrically conductive, malleable mount member 215 (and thus to the plenum partition) and joint 214 securing and electrically coupling the final cell in the stack to an electrically conductive lid 218 that caps the free end of the stack. Lid 218 may be implemented by an electrically conductive metal, or by composite materials (e.g., a glass and/or ceramic structure having a conductive underplate electrically coupled to joint 214). In the embodiment shown, a lead wire 221, conductive rod or the like is coupled to lid 218 (or a conductive component thereof) to form the positive terminal of the cell stack. In converters with multiple cell stacks, the lead wire 221 for each cell stack is routed through the corresponding opening in the plenum partition, and may either be joined with the lead wires for other cell stacks (if there is more than one stack) before egressing from the plenum housing, or may exit directly from the plenum at a respective egress point (i.e., isolated from the plenum wall which is forms the negative terminal of the cell).

Still referring to FIG. 4, projecting isolation members are provided overcome shunt surface currents that plague prior-art converter 120 (FIG. 1B). More specifically, a ring-shaped isolation member 225, referred to herein as the anode-side isolator, is disposed about the outer circumference of each electrolyte cell between the anode 207 of the cell and the brazed interconnect 211 to the anode of the higher potential cell. A similar cathode-side isolator 227 may also be disposed about the inner circumference of each cell between the cathode 209 of the cell and the brazed interconnect to the cathode of the lower potential cell. In both cases, the isolators perform the dual functions of covering otherwise exposed sections of electrolyte plate 205 (limiting the electrolyte/interconnect junction to sodium vapor and thus preventing triple points and the undesired shunt currents they enable) and increasing the surface path length between interconnect 211 and electrodes of higher or lower potential. The increased surface path length is particularly effective for blocking surface-level shunt currents (i.e., electron flow across the surface of the cell wall in sodium vapor) believed to plague the prior-art approach of FIG. 1B, as those power-sapping currents are blocked off without having to widen the dead space between the anode and interconnect to the higher potential cell.

FIG. 5 illustrates an expanded view of the cell-to-cell interconnect 211 and projecting isolators of FIG. 4, emphasizing the extended surface path length 'Z' between anode 207 and cell interconnect 211 (i.e., around the anode-side isolator). In one embodiment, for example, the extended surface path length is at least twice the distance 'X' between the anode and cell interconnect (i.e., through the electrically insulating isolator as if the isolating member was omitted). In one embodiment, the projection distance 'Y' (i.e., the distance by which the anode-side isolator projects away from the cell stack which, in this example is measured from the surface of the solid electrolyte plate) is substantially greater than (e.g., at least 50% greater) than the thickness of anode 207 and/or at least as long as the direct distance 'X' between anode 207 and interconnect 211. Other embodiments may employ projecting isolators of any dimensions sufficient to limit shunt current between the anode of a given cell and the interconnect to the higher potential cell. Similar considerations hold for dimensions of the cathode-side isolator, though smaller isolator width and projection distance may apply (e.g., 75% or 50% of the corresponding dimension of the anode-side isolator).

The projecting isolators shown in FIGS. 4 and 5 may be implemented from any electrically insulating material sufficient to withstand the metal vapor environment of the high and low pressure chambers including, for example, and without limitation, alumina, zirconia or other high temperature glass, ceramic or cermet. Also, a high temperature glass frit 231 or other attachment material may be used to attach isolation members (or insulator) to the solid electrolyte plate, as shown for example in detail view 230.

FIG. 5 also illustrates a composite interconnect structure that may be employed to electrically interconnect and seal the gap between neighboring cells instead of continuous brazed joint 211. In the embodiment shown, the composite interconnect includes a washer 237 (e.g., formed from Molybdenum, Titanium, Tantalum, Niobium, metal alloys, etc.) having an S-shaped cross-section bounded by glass frits 237 (or other insulating medium) that secure the washer between the solid electrolyte plates of adjacent cells. End-point brazed joints 239 are provided to electrically couple washer 237 to the electrodes (cathode and anode) of the neighboring cells. In alternative embodiments, washer 237 may have a substantially rectangular (or otherwise quadrilateral) cross-section, with end-point brazed joints being extended to make up the distance between the cell electrodes and the washer. Though continuous brazed joints are generally depicted in connection with embodiments described herein, in all such cases, composite interconnect structures may be used, including but not limited to the composite interconnect structure shown in FIG. 5.

FIG. 6 illustrates an alternative interconnection of thermoelectric cells in a projecting cell stack. As shown, projecting isolation members 255 and 257 extend into the region between the solid electrolyte plates 245 of neighboring cells, thus completely isolating the solid electrolyte from the cell-to-cell interconnect (i.e., brazed joint 251). In the embodiment shown, a glass or ceramic joint 253 is provided to attach projecting isolation members 255, 257 to respective electrolyte plates 245, and the interconnect 251 extends through a channel formed between the isolation members, securing the isolation members to one another and thus sealing the gap between adjacent cells while at the same time forming the cell-to-cell electrical interconnection. As FIG. 6 demonstrates, the anode and cathode electrodes (247, 249) extend along the entire length of the solid electrolyte plate (i.e., there is no isolation gap) and may extend beyond ceramic joint 253 and part or all of the short side of either or both of projecting isolation members 255 and 257.

Figure 7:
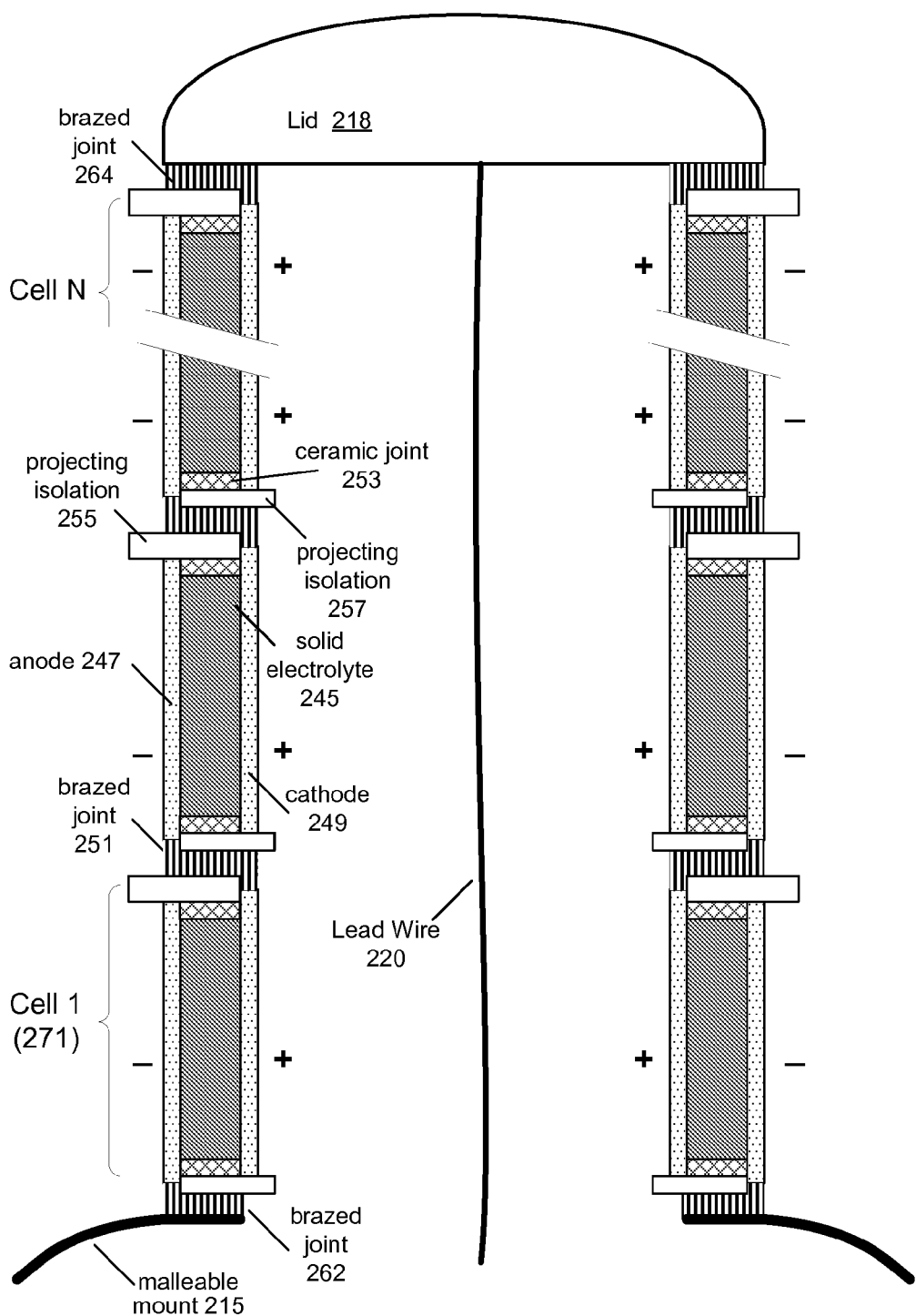
FIG. 7 illustrates a cross-sectional view of a projecting cell stack according to the isolated-electrolyte embodiment of FIG. 6.
Figure 8:
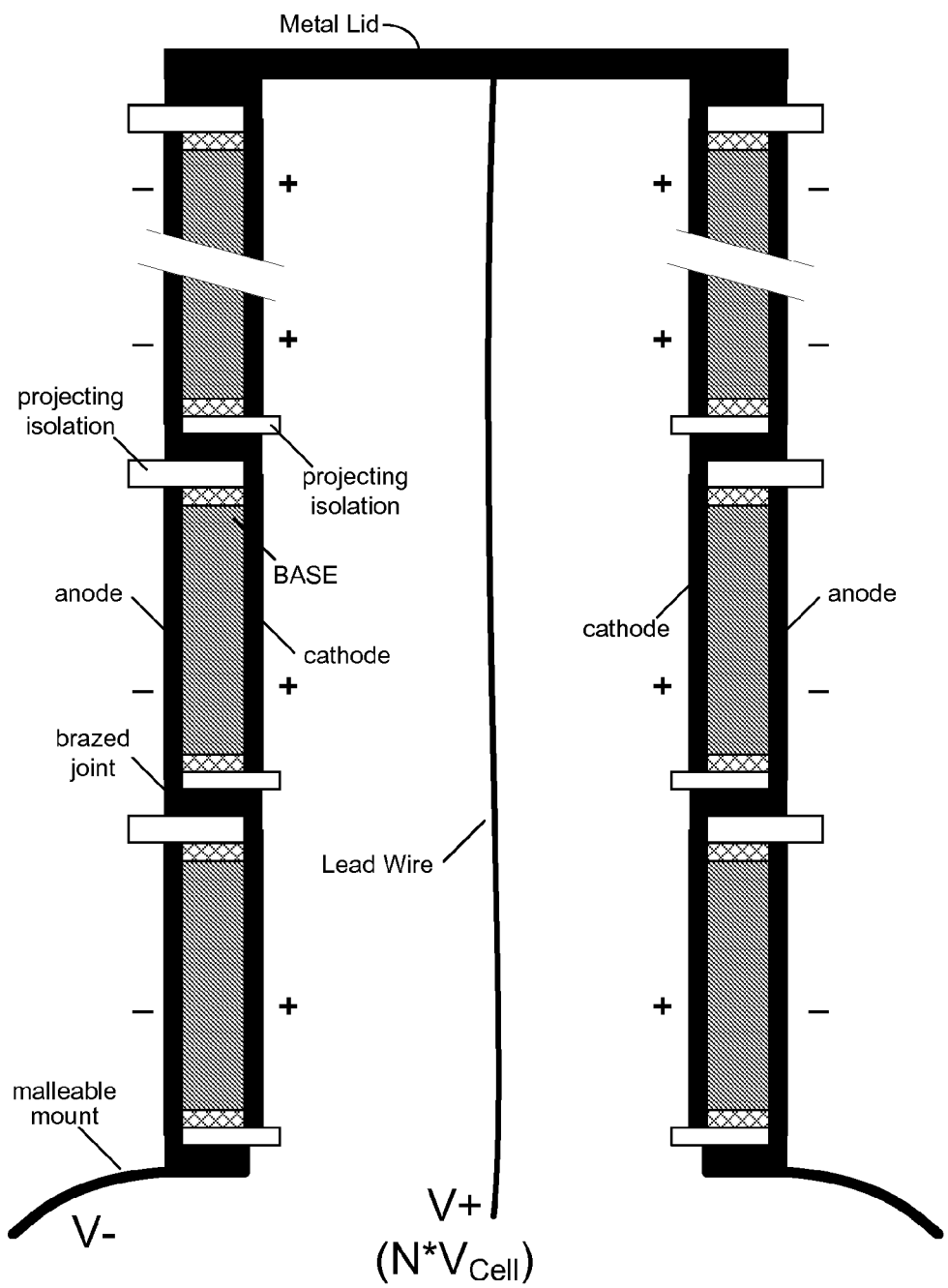
FIG. 8 illustrates the overall electrical interconnection achieved by the embodiment of FIG. 7.

FIG. 7 illustrates a cross-sectional view of a projecting cell stack according to the isolated-electrolyte embodiment of FIG. 6. As in the embodiment of FIG. 4, continuous brazed joints 262, 264 are used to electrically interconnect a number of cells 271 in series between malleable mount 215 (i.e., for mounting the base cell about a partition opening) and metal or composite lid 218. Through the arrangement shown, a relatively high voltage, low ohmic-loss cell is achieved, with the projecting isolation members suppressing shunt currents and enabling the use of relatively high impedance porous electrodes anode and cathode as the sole current collection and conduction mechanisms across the cell walls. FIG. 8 illustrates the overall electrical interconnection achieved by the embodiment of FIG. 7, with all conductors heavily shaded to emphasize electrical interconnects. As in the embodiments discussed above, the single-side mechanical connection of the cell stack permits the cell stack to thermally expand and contract without suffering the mechanical stress/strain forces that rapidly wear cell stacks secured between opposite ends of a plenum. Thus, the projecting cell stack of FIGS. 7 and 8 enables a highly practical, efficient and robust thermoelectric converter that may be deployed in a variety of applications, including those requiring frequent temperature cycling.

FIGS. 9A-9C illustrate alternative implementations of discrete and plate-integrated isolators that may be used to implement the projecting isolators (or insulators) described in reference to FIGS. 4-8. More specifically FIG. 9A illustrates a cell cross section 301 in which discrete ring-shaped isolators 303a and 303b are secured to the exterior and interior surfaces of the electrolyte plate 305 (e.g., in respective regions at opposite ends of the plate uncovered by porous electrodes), and thus generally corresponds to the structure described in reference to FIGS. 4 and 5 (note that the discrete isolators 303a and/or 303b may alternatively be secured to top/bottom surfaces of the electrolyte plate as shown in FIGS. 6-8). By contrast, FIGS. 9B and 9C illustrate plate-integrated embodiments of projecting isolators in which the projecting isolator is formed integrally with the solid electrolyte plate. In the embodiment shown in cell cross-section 311 of FIG. 9B, radial projections 314, 316 of electrolyte plate 312 at either end (i.e., inward at one end and outward at the other) are coated with a high-dielectric material, such as high-temperature glass, to form the projecting isolations described above. In the embodiment shown in cell cross-section 321 of FIG. 9C, radial electrolyte projections 324 and 326 are diffused or otherwise implanted with dopant to destroy ionic and electronic conductivity, again forming projecting isolations that increase the surface path length between cell interconnect structures and adjacent electrodes of higher/lower potential.

FIG. 10 illustrates a lumped-element model of the resistance of the electrodes (electron conductors) and electrolyte (ion conductor) of a thermoelectric cell within a projecting cell stack (350), and a simplified equivalent circuit (360). In general, the maximum power for any generator occurs when connected to a matched impedance load, Z, and is described by $P=V^2/4Z$, where V is the generator open circuit voltage, and Z is the generator impedance. The open circuit voltage is influenced by converter operating temperature, and converters are generally subject to two types of power losses: parasitic losses, and $I^2R$ losses in the generator impedance. Applying these insights and known values of specific power for alkali-metal thermal-to-electric conversion cathodes, an efficient, high power thermoelectric converter can be produced when: i) the parasitic losses are sufficiently limited and 2) the $I^2R$ losses are low enough to yield a specific power greater than approximately 300 milliwatts (300 mW) for every square centimeter of cathode area at less than 900° C. operating temperature. The intrinsic losses in the device include the sodium cycle losses or potassium cycle losses (i.e., latent heat of evaporation) as well as pump power, if an electromagnetic pump is used. The parasitic losses consist mainly of the thermal losses (radiation and thermal conduction from hot to cold side) and shunt current losses due to the isolation resistance between cells. For shorter cells that have a high impedance, a higher impedance isolation is used between the cells (e.g., as in the projecting isolation structures described above) to reduce this parasitic loss. As discussed above, projecting the cell stack into the high vapor pressure chamber (i.e., the hot side) significantly reduces the thermal losses by shielding the hot electrolyte within the high pressure chamber, and the sodium cycle losses are largely fixed. The resistive $I^2R$ losses in the generator are equal to the output power when maximum power is delivered to a matched load, so the resistive losses should generally be low enough to meet design goals (e.g., 300 mW/cm² at less than 900° C., or higher or lower power densities at higher or lower operating temperatures, respectively). In a number of embodiments herein, a cathode that provides both 1) a site for neutralization of the sodium ions by electrons and 2) low sodium backpressure on the low pressure side to maintain high voltage is implemented by a thin deposited (or otherwise formed) layer of conductive material with a very short current collection distance. By limiting the cell height (and thus the current collection distance) to a dimension that avoids undue $I^2R$ losses and cathode thickness to a dimension that avoids undue backpressure against the vapor channel (i.e., through the electrodes and electrolyte wall) a target power density (e.g., 300 mW/cm² at less than 900° C. in one embodiment) may be achieved without requiring costly and unreliable auxiliary current collection structures. Stacked cell projections in which the height of each constituent cell is under 3.0 cm or even under 1.0 cm (e.g., 8 mm) or has a ratio of axial length to diameter of 0.1 to 1 have been determined to meet such design goals, though projecting cell stacks having cell heights and/or aspect ratios outside those ranges may be employed in other embodiments.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of cells, cell stacks, cell dimensions, material types, component shapes, manner of interconnection or construction and the like may be different from those described above in alternative embodiments. The term "coupled" is used herein to express a direct connection as well as a connection through one or more intervening circuits or structures. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A thermoelectric converter comprising:
   a plenum;
   a partition secured to the plenum in an orientation that divides the plenum into first and second chambers;
   a plurality of alkali-metal thermoelectric conversion cells disposed in a stack and electrically coupled in series to generate a voltage in proportion to the number of thermoelectric conversion cells in the stack, the thermoelectric conversion cells including an initial conversion cell and a final conversion cell wherein (i) the initial conversion cell is closest to the partition and the stack extends into the first chamber in a direction towards the final conversion cell and (ii) the initial conversion cell is secured to the partition over an opening therein, a final conversion cell is unsecured with respect to the partition and the plenum; and a lid secured to the final conversion cell of the stack to separate an interior region of the stack from the first chamber, the interior region of the stack forming part of the second chamber by virtue of the opening in the partition.

2. The thermoelectric converter of claim 1 wherein the thermoelectric conversion cells in the stack are mechanically joined to seal the interior region of the stack from the first chamber.

3. The thermoelectric converter of claim 1 wherein the plenum comprises a vapor input to receive a flow of alkali metal vapor sufficient to maintain a pressure differential between the first and second chambers.

4. The thermoelectric converter of claim 3 wherein the flow of alkali metal vapor is received into the first chamber of the plenum such that (i) the first chamber is at a higher pressure than the second chamber, and (ii) the pressure differential effects a compression force on joints between the thermoelectric conversion cells in the stack.

5. The thermoelectric converter of claim 1 further comprising a malleable stack mount member that secures the stack to the partition about the opening and that electrically couples a terminal of the initial conversion cell to the partition, the malleable stack mount permitting the stack of thermoelectric conversion cells to thermally expand and contract at a different rate than the partition without disruptive stress.

6. The thermoelectric converter of claim 1 further comprising a conductor coupled to the lid and extending through the interior region of the stack to form a first electrical terminal of the stack.

7. The thermoelectric converter of claim 1 further comprising a plurality of additional stacks of alkali-metal thermoelectric conversion cells, each additional stack of thermoelectric conversion cells projecting into the first chamber and having an initial conversion cell secured about a respective opening in the partition and, a first conversion cell that is unsecured with respect to the partition and the plenum.

8. The thermoelectric converter of claim 1 wherein the stack of thermoelectric conversion cells projects into the first chamber orthogonally from the partition.

9. The thermoelectric converter of claim 1 wherein:

adjacent first and second conversion cells within the stack are mounted to one another and each include a solid electrolyte member disposed between an anode and a cathode;

an electrical interconnect structure extending from the cathode of the first conversion cell to the anode of the second conversion cell; and a first conversion electrically insulating barrier disposed between the anode of the first cell and the electrical interconnect structure and projecting away from the stack by a distance substantially greater than a thickness of the anode of the first conversion cell.

10. The thermoelectric converter of claim 9 wherein a distance, Z, from the anode of the first conversion cell to the electrical interconnect structure over a surface of the first electrically insulating barrier is at least twice a distance, X, from the anode of the first conversion cell to the electrical interconnect structure through the first electrically insulating barrier.

11. The thermoelectric converter of claim 9 further comprising a second electrically insulating barrier disposed between the cathode of the second conversion cell and the electrical interconnect structure and projecting away from the stack in a direction opposite the projection of the first electrically insulating barrier.

12. The thermoelectric converter of claim 9 wherein the first electrically insulating barrier is secured to the solid electrolyte member of the first conversion cell via a glass frit.

13. The thermoelectric converter of claim 9 wherein the first electrically insulating barrier has a substantially quadrilateral cross section.

14. The thermoelectric converter of claim 9 wherein the first electrically insulating barrier extends between the solid electrolyte members of the adjacent first and second conversion cells.

15. The thermoelectric converter of claim 9 wherein the first electrically insulating barrier comprises at least one of alumina, zirconia, high temperature glass, ceramic or cermet.

16. The thermoelectric converter of claim 9 wherein the electrical interconnect structure comprises a brazed joint that extends continuously from the cathode of the first conversion cell to the anode of the second conversion cell and physically secures the first and second conversion cells to one another with the stack.

17. The thermoelectric converter of claim 1 wherein adjacent first, second and third conversion cells within the stack each include a respective solid electrolyte member, anode and cathode, the solid electrolyte member disposed between the anode and cathode as an ionic conductor and electronic insulator, the cathode of the first conversion cell being coupled to the anode of the second conversion cell to effect series electrical coupling between the first and second conversion cells, and the cathode of the second conversion cell being coupled to the anode of the third conversion cell to effect series electrical coupling between the second and third conversion cells.

* * * * *